United States Patent [19]

Kim et al.

[11] Patent Number: 6,066,554

[45] Date of Patent: May 23, 2000

[54] METHOD OF MANUFACTURING THREE ELEMENTAL DIFFUSION BARRIER LAYER

[75] Inventors: Youn Tae Kim; Chi Hoon Jun; Jong Tae Baek, all of Daejon-Shi, Rep. of Korea

[73] Assignee: Electronics and Telecommunications Research Institute, Taejon-Shi, Rep. of Korea

[21] Appl. No.: 08/959,095

[22] Filed: Oct. 28, 1997

[30] Foreign Application Priority Data

Jul. 11, 1996 [KR] Rep. of Korea ................ 96-52620

[51] Int. Cl.$^7$ ............................................. H01L 21/4763
[52] U.S. Cl. ................... 438/627; 438/628; 438/630; 438/642; 438/643; 438/644; 438/648; 438/649; 438/652; 438/653; 438/654; 438/655; 438/656; 438/658; 438/660; 438/664; 438/685
[58] Field of Search ................................. 438/627, 628, 438/630, 642, 643, 644, 648, 649, 652–656, 658, 660, 664, 685

[56] References Cited

U.S. PATENT DOCUMENTS 4,855,798 8/1989 Imamura et al. ...................... 357/71
5,639,678 6/1997 Lee et al. ............................... 437/41

OTHER PUBLICATIONS

Tadashi Iijima et al., *Inlaid Cu Interconnects Employing Ti–Si–N Barrier Metal for ULSI Applications*, Apr. 1996, pp. 568–572, IEICE Trans Electron vol. E79–C No. 4.

*Primary Examiner*—John F. Niebling
*Assistant Examiner*—David Zarneke
*Attorney, Agent, or Firm*—Cohen, Pontani, Lieberman & Pavane

[57] ABSTRACT

A three elemental compound for diffusion barrier layer having a superior diffusion barrier characteristics manufactured by forming the compound between the silicon diffused into the diffusion barrier layer and the two elemental compound for diffusion barrier layer before the metal wire layer penetrates into the diffusion barrier layer to reach the underlying silicon layer, using the different characteristics of the diffusion rate as above, is disclosed. A method of forming three elemental compound for diffusion barrier layer according to the present invention comprises a silicon substrate. A silicide layer is deposited on the silicon substrate. A refractory metal nitride layer is then deposited on the silicide layer. A metal wire layer is deposited on the refractory metal nitride layer. A heat treatment of the resulting structure is performed to form a three elemental compound for diffusion barrier layer between the silicide layer and the refractory metal nitride layer by out-diffusing a silicon contained in the silicide layer and reacting the silicon introduced into the refractory metal nitride layer with the refractory metal nitride layer, such that the diffusion barrier characteristics is improved.

11 Claims, 3 Drawing Sheets

METHOD OF MANUFACTURING THREE ELEMENTAL DIFFUSION BARRIER LAYER

BACKGROUND OF THE INVENTION

1. Field of the Invention

The present invention relates to a method for manufacturing a three elemental diffusion barrier layer for a semiconductor metal wiring, and more particularly, to a method for manufacturing the same which is comprised of a nitride layer of refractory metal or a chemical compound of refractory metal and a Nitrogen ($N_2$) as a primary material.

2. Description of the Related Art

Generally, an ideal diffusion barrier layer in a manufacturing process of forming a semiconductor metal wiring should not only physically and chemically be stable at the interface between a metal and Silicon (Si) or a metal and a Silicon Oxide ($SiO_2$) due to the lower reactivity relative to the underlying layer, but also be an amorphous structure in order to avoid the diffusion from a grain boundary at a high temperature. Especially, in order to use a chemical compound as the diffusion barrier layer for Copper (Cu) which easily initiates the diffusion at a relatively low temperature, it has been presently introduced that an amorphous type of two elemental compound comprised of Ta—Si, Ti—Si, Ti—N or etc., or three elemental compound comprised of Ta—Si—N, Ti—Si—N, W—Si—N or etc are the most useful compounds.

Further, the two elemental compound takes the amorphous type of compound, for example, $Ta_{74}Si_{26}$, which minimizes the grain bound by the addition of Si thereto in order to compensate the drawback of single transition metal layer having temperature characteristics (reactive temperature of the silicon and copper) for diffusion barrier layer from the grain boundary at a low temperature due to the polycrystalline structure.

However, the crystallization temperature of the two elemental compound rapidly decreases upon the contact with Cu, such that the temperature characteristics for diffusion barrier layer is deteriorated. In case of, for example, $Ta_{74}Si_{26}$, it decreases from 850° C. to 650° C. Therefore, in order to improve the temperature characteristics for diffusion barrier layer, it requires to provide the amorphous type of three elemental compound having a high crystallization temperature due to the addition of other elements, for example, $N_2$ and etc..

In general, the three elemental compound for diffusion barrier layer may be achieved by the following methods: a sputtering method using a target obtained by the composition rate of the three elemental compound, a reactive sputtering method forming a target of the two elemental compound for diffusion barrier layer, for example, Ta—Si, Ti—Si, W—Si and a chemical deposition method using a gaseous material and a precursor.

One of the severe problems encountered with these conventional methods lies in that according to the sputtering method of forming general three elemental compound for diffusion barrier layer, the target should be manufactured with the uniform composition rate of the three elemental compound. Further, in case of the reactive sputtering method, it is required to precisely adjust the condition gas of $N_2$ for controlling the composition for diffusion barrier layer. Furthermore, it should be required for the chemical deposition method mentioned above to precisely control the introducing of the gaseous material. In case of the chemical deposition method for the organic metal, it is difficult to manufacture the precursor having a superior deposition characteristics and to obtain the repeatability of deposition.

Therefore, it is an object of the present invention to overcome the above disadvantages and provide a method for forming a three elemental compound for diffusion barrier layer capable of simplifying the manufacturing process thereof by depositing the two elemental compound at the initial stage and performing an out-diffusion of Si by the application of the heat treatment.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

A three elemental compound for diffusion barrier layer of the present invention is defined by the claims with a specific embodiment shown in the attached drawings. For the purpose of summarizing the invention, the method of forming the three elemental compound for diffusion barrier layer according to the first embodiment of the present invention is provided which comprises the steps of preparing a silicon substrate. A silicide layer is deposited on the silicon substrate, and a refractory metal nitride layer is deposited on the silicide layer. A metal wire layer is deposited on the refractory metal nitride layer. A heat treatment of the resulting structure is performed to form a three elemental compound for diffusion barrier layer between the silicide layer and the refractory metal nitride layer by out-diffusing a silicon contained in the silicide layer and reacting the silicon introduced into the refractory metal nitride layer with the refractory metal nitride layer, whereby the diffusion barrier characteristics is improved.

In accordance with the second embodiment of the present invention, the method for forming the three elemental compound for diffusion barrier layer comprises a silicon substrate. A refractory metal nitride layer is deposited on the silicon substrate. A metal wire layer is deposited on the refractory metal nitride layer at a low temperature. A heat treatment of the resulting structure is performed to form both a silicide layer on the silicon substrate and a three elemental compound for diffusion barrier layer between the silicide layer and the refractory metal nitride layer by out-diffusing a silicon contained in the silicide layer and reacting the silicon introduced into the refractory metal nitride layer with the refractory metal nitride layer, such that the diffusion barrier characteristics is improved.

In accordance with the third embodiment of the present invention, the method for forming the three elemental compound for diffusion barrier layer comprises the steps of A method of forming three elemental compound for diffusion barrier layer comprises a silicon substrate. A refractory metal layer is deposited on the silicon substrate. A silicide layer and a refractory metal nitride layer is formed on the silicon substrate by performing a heat treatment of the resulting structure to thermally convert the refractory metal layer. A metal wire layer is deposited on the refractory metal nitride layer at a low temperature. A heat treatment of the resulting structure is performed to form a three elemental compound for diffusion barrier layer between the silicide layer and the refractory metal nitride layer by out-diffusing a silicon contained in the silicide layer and reacting the silicon introduced into the refractory metal nitride layer with the refractory metal nitride layer, whereby the anti-diffusion characteristics is improved.

BRIEF DESCRIPTION OF THE DRAWINGS

The present invention will become more apparent upon a detailed description of the preferred embodiments for carrying out the invention as rendered below. In the description to follow, references will be made to the accompanying drawings, where like reference numerals are used to identify like or similar elements in the various drawings and in which.

DETAILED DESCRIPTION OF THE INVENTION

A method for forming the three elemental compound for diffusion barrier layer according to the present invention will now be described with reference to the accompanying drawings hereinafter.

FIGS. 1A to 1D are processes steps sequentially representing a method for forming the three elemental compound for diffusion barrier layer according to the first embodiment of the present invention.

Figure 1A:
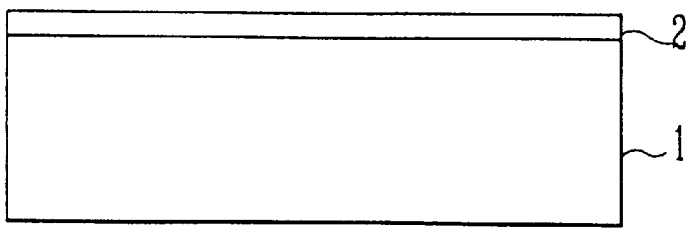
FIGS. 1A through 1D are processes steps sequentially illustrating a method for forming the three elemental compound for diffusion barrier layer according to the first embodiment of the present invention.
Figure 1B:
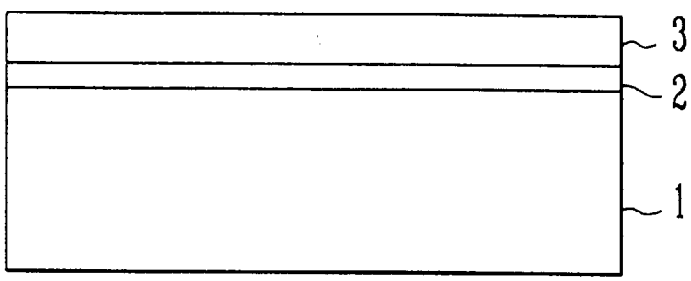
Figure 1C:
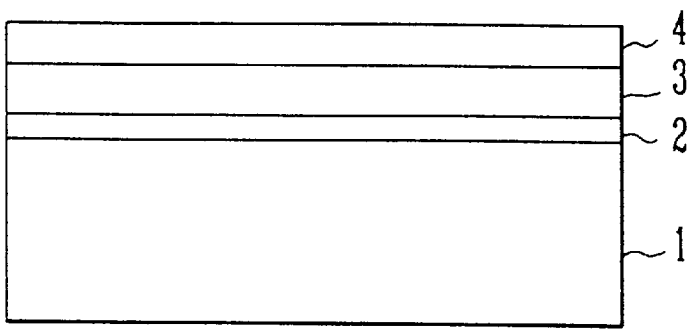

Referring now to FIG. 1A, it is shown that a silicide layer 2 of refractory metal is deposited on a silicon substrate 1 to reduce a contact resistance. FIG. 1B illustrates that a refractory metal nitride layer 3, for example, TiN, TaN, WN or etc., is deposited on the silicide layer 2. In FIG. 1C, it represent that a metal wire layer 4, for example, Al or Cu, is deposited on the refractory metal nitride layer 3 at a low temperature.

Figure 1D:
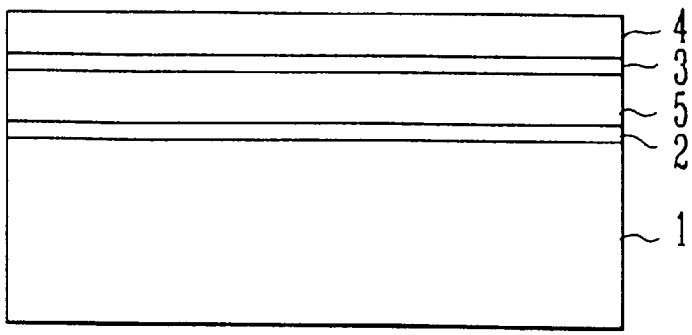

FIG. 1D shows that the resulting structure is then heated to improve the characteristics of the metal wire layer 4 and out diffuse the silicon contained in the silicide layer 2, such that the silicon introduced into the refractory metal nitride layer 3 is reacted with the refractory metal nitride layer 3, whereby the three elemental compound for diffusion barrier layer 5 is formed between the silicide layer 2 and the refractory metal nitride layer 3, as shown in the drawing.

Figure 2A:
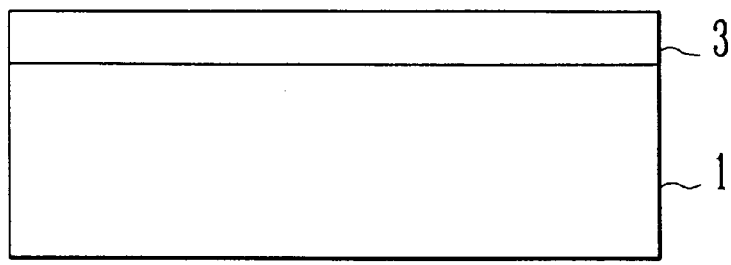
FIGS. 2A through 2C are processes steps sequentially illustrating a method for forming the three elemental compound for diffusion barrier layer according to the second embodiment of the present invention.
Figure 2B:
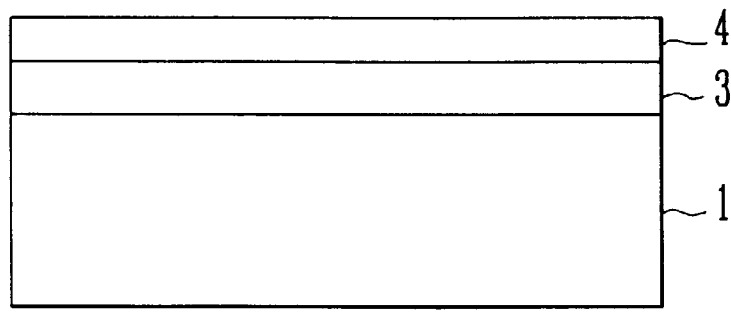
Figure 2C:
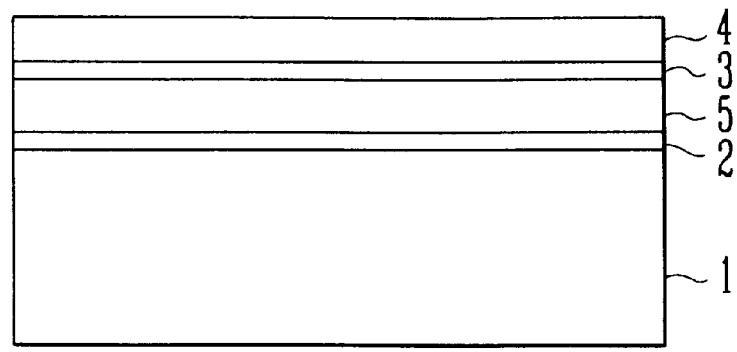

FIGS. 2A and 2C are processes steps sequentially illustrating a method for forming the three elemental compound for diffusion barrier layer according to the second embodiment of the present invention.

Turning now to FIG. 2A, it represents that the refractory metal nitride layer 3, for example, TiN, TaN, WN or etc., is deposited on a silicon substrate 1. FIG. 2B illustrates that the metal wire layer 4, for example, Al or Cu, is then deposited on the refractory metal nitride layer 3 at a low temperature.

In FIG. 2C, it shows that in order to improve the characteristics of the metal wire layer 4 and out diffuse the silicon contained in the silicon substrate 1, the resulting structure is subjected to the heat treatment to form the silicide layer 2 on the silicon substrate 1 by the diffusion of the metal wire layer 4.

Further, since the silicon is diffused into the refractory metal nitride layer 3 by the heat treatment, the three elemental compound for diffusion barrier layer 5 is also formed by reacting the silicon introduced into the refractory metal nitride layer 3 with the refractory metal nitride layer 3, as shown in FIG. 2C.

Figure 3A:
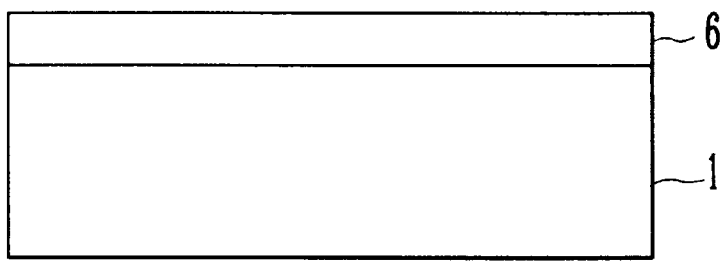
FIGS. 3A through 3D are processes steps sequentially illustrating a method for forming the three elemental compound for diffusion barrier layer according to the third embodiment of the present invention.
Figure 3B:
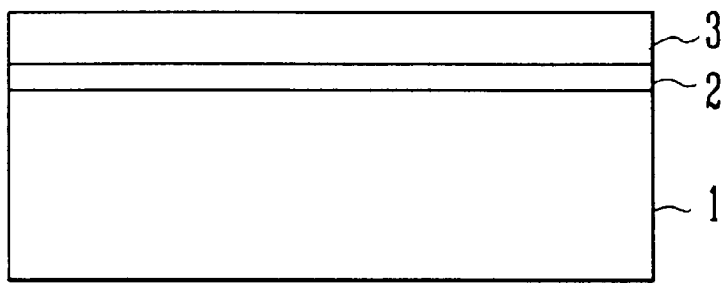
Figure 3C:
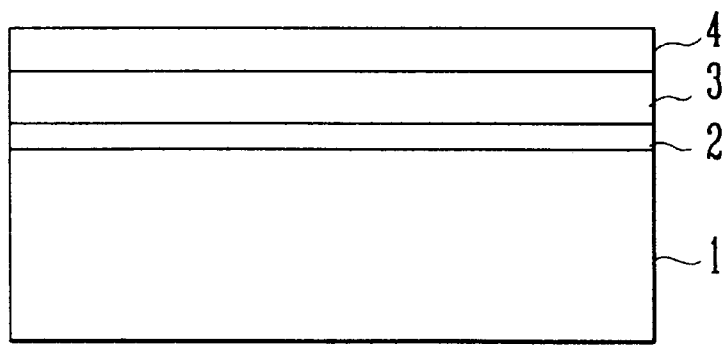
Figure 3D:
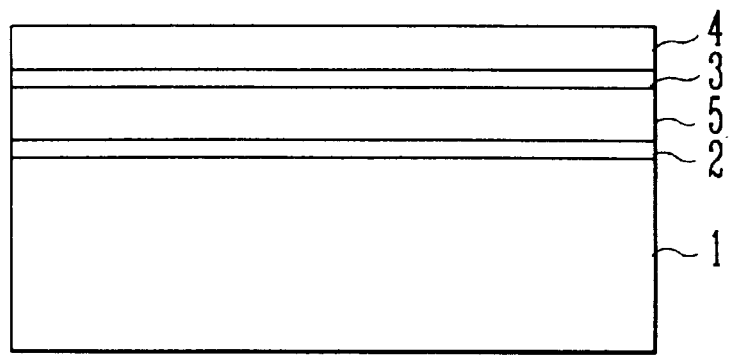

FIGS. 3A and 3D are processes steps sequentially showing a method for forming the three elemental compound for diffusion barrier layer according to the third embodiment of the present invention.

Turning now to FIG. 3A, it represents that a refractory metal layer 6, for example, Ti, Ta, W or etc., is deposited on a silicon substrate 1. FIG. 3B illustrates that the silicide layer 2 and the refractory metal nitride layer 3 is formed by heating the refractory metal layer 6 in the presence of the nitrogen gas to thermally convert the refractory metal layer 6. In FIG. 3C, it shows that the metal wire layer 4, for example, Al or Cu, is then deposited on the refractory metal nitride layer 3 at a low temperature by heating the refractory metal layer 6.

FIG. 3D represents that the resulting structure is then heated to improve the characteristics of the metal wire layer 4 and out diffuse the silicon contained in the silicide layer 2, such that the silicon introduced into the refractory metal nitride layer 3 is reacted with the refractory metal nitride layer 3, whereby the three elemental compound for diffusion barrier layer 5 is formed between the silicide layer 2 and the refractory metal nitride layer 3, as shown in the drawing.

As mentioned above, since the heat treatment for diffusing the silicon in connection with the first, second and third embodiment of the present invention is compatible with the heat treatment for improving the characteristics of the metal wire layer, an additional heat treatment is not required. The heat treatment for improving the characteristics of the metal wire layer is necessarily used in the conventional wiring process. Particularly, in the case of copper wire layer, the superior characteristics in the resistivity thereof is remarkably improved.

Therefore, according to the heat treatment used in the present invention, the improvement of the characteristics of the metal wire layer and the out-diffusion of the underlying silicon layer and the diffusion of the metal wire layer into the anti-diffusion layer is simultaneously obtained. At the time, the diffusion rate of the silicon into the diffusion barrier layer is far more faster as compared to that of the metal wire layer into the diffusion barrier layer.

Using the different characteristics of the diffusion rate as above, the three elemental compound for diffusion barrier layer having a superior diffusion barrier characteristics can be manufactured by forming the compound between the silicon diffused into the diffusion barrier layer and the tow elemental compound for diffusion barrier layer before the metal wire layer penetrates into the diffusion barrier layer to reach the underlying silicon layer. Therefore, the diffusion of the metal wire layer can be effectively prevented with the provision of the three elemental compound for diffusion barrier layer gradually formed form the underlying layer by using the method mentioned above.

As fully described above, according to the present invention, it has superior advantages that the three elemental compound for diffusion barrier layer having a superior diffusion barrier characteristics can be manufactured simultaneously with improving the characteristics of the metal wire layer by the heat treatment, without requiring an additional heat treatment, such that the manufacturing process thereof may be simplified. Further, the thin thickness of the three elemental compound for diffusion barrier layer having a superior diffusion barrier characteristics can also be obtained by diffusing the silicone into the two elemental compound of the refractory metal nitride layer.

The present invention and its advantages have been described with reference to a particular embodiment in connection with a particular application. Those having ordinary skill in the art and access to the teachings of the present invention will recognize additional modifications and applications within the scope thereof. It is therefore intended by the appended claims to cover any and all such applications, modifications, and embodiments within the scope of the present invention.

What is claimed is:

1. A method of forming a diffusion barrier layer in a semiconductor device, comprising the steps of:

preparing a silicon substrate;

depositing a silicide layer on the prepared silicon substrate;

depositing a refractory metal nitride layer on the silicide layer;

depositing a metal wire layer on the refractory metal nitride layer; and heating the resulting structure to form a diffusion barrier layer between the silicide layer and the refractory metal nitride layer, said heating causing a silicon contained in the silicide layer to diffuse therefrom into the refractory metal nitride layer and to react therewith such that a diffusion barrier layer is formed between the silicide layer and the refractory metal nitride layer.

2. The method of claim 1, wherein the silicide layer comprises a refractory metal.

3. The method of claim 1, wherein the refractory metal nitride layer is selected from a group of compounds consisting of TiN, TaN and WN.

4. The method of claim 1, wherein the metal wire layer is selected from a group of elements consisting of Al and Cu.

5. A method of forming a diffusion barrier layer in a semiconductor device, comprising the steps of:

preparing a silicon substrate;

depositing a refractory metal nitride layer on the prepared silicon substrate;

depositing a metal wire layer on the refractory metal nitride layer at a predetermined temperature; and heating the resulting structure to form both a silicide layer on the silicon substrate and a diffusion barrier layer between the silicide layer and the refractory metal nitride layer, said heating causing a silicon contained in the silicide layer to diffuse therefrom into the refractory metal nitride layer and to react therewith such that a diffusion barrier layer is formed between the silicide layer and the refractory metal nitride layer.

6. The method of claim 5, wherein the metal wire layer is selected from a group of elements consisting of Al and Cu.

7. A method of forming a diffusion barrier layer in a semiconductor device, comprising the steps of:

preparing a silicon substrate;

depositing a refractory metal layer on the prepared silicon substrate thereby forming a multi-layer structure;

heating the resulting multi-layer structure so as to thermally convert the refractory metal layer deposited on the silicon layer to a silicide layer and a refractory metal nitride layer;

depositing a metal wire layer on the refractory metal nitride layer at a predetermined temperature; and heating the resulting structure to form a diffusion barrier layer between the silicide layer and the refractory metal nitride layer, said heating causing a silicon contained in the silicide layer to diffuse therefrom into the refractory metal nitride layer and to react therewith such that a diffusion barrier layer is formed between the silicide layer and the refractory metal nitride layer.

8. The method of claim 7, wherein the refractory metal layer is selected from a group of elements consisting of Ti, Ta and W.

9. The method of claim 7, wherein the refractory metal layer is thermally converted in the presence of nitrogen gas during said step of heating the multi-layer structure.

10. The method of claim 7, wherein the metal wire layer is selected from a group of elements consisting of Al and Cu.

11. The method of claim 5, wherein the refractory metal nitride layer is selected from a group of compounds consisting of TiN, TaN and WN.

* * * * *